United States Patent
Li et al.

(10) Patent No.: US 10,446,798 B2
(45) Date of Patent: Oct. 15, 2019

(54) TOP-EMITTING WOLED DISPLAY DEVICE

(71) Applicant: Shenzhen China Star Optoelectronics Technology Co., Ltd., Shenzhen, Guangdong (CN)

(72) Inventors: Xianjie Li, Guangdong (CN); Qiming Peng, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 247 days.

(21) Appl. No.: 15/500,298

(22) PCT Filed: Jan. 22, 2017

(86) PCT No.: PCT/CN2017/072028
§ 371 (c)(1),
(2) Date: Jan. 31, 2017

(87) PCT Pub. No.: WO2018/032728
PCT Pub. Date: Feb. 22, 2018

(65) Prior Publication Data
US 2019/0006627 A1     Jan. 3, 2019

(30) Foreign Application Priority Data
Aug. 18, 2016 (CN) .......................... 2016 1 0685005

(51) Int. Cl.
*H01L 29/08* (2006.01)
*H01L 51/52* (2006.01)
(Continued)

(52) U.S. Cl.
CPC .......... *H01L 51/5275* (2013.01); *H01L 27/32* (2013.01); *H01L 27/322* (2013.01);
(Continued)

(58) Field of Classification Search
CPC .................................................. H01L 51/5275
(Continued)

(56) References Cited

U.S. PATENT DOCUMENTS

2006/0087225 A1* 4/2006 Liao .................... H01L 51/5036
                                                              313/504
2012/0243219 A1   9/2012 Ohsawa et al.
(Continued)

FOREIGN PATENT DOCUMENTS

CN      104143559 A      11/2014
JP      2012252933 A     12/2012

OTHER PUBLICATIONS

International Search Report with Written Opinion under International Application No. PCT/CN2017/072028 dated May 8, 2017.
(Continued)

*Primary Examiner* — Ajay Arora

(57) ABSTRACT

Disclosed is a top-emitting WOLED display device. An optical turning layer with a uniform thickness is added between anode layers of three sub-pixels R, G and B and a reflective metal layer of the display device. Because of arrangement of the optical turning layer, a distance between a WOLED layer and a reflective metal layer is increased. Thus, a total cavity length of a white OLED is increased, and a microcavity effect of a top-emitting WOLED is overcome. The optical turning layer is suitable for manufacture of AMOLED display devices with high-resolution and color gamut.

16 Claims, 3 Drawing Sheets

(51) Int. Cl.
*H01L 51/50* (2006.01)
*H01L 27/32* (2006.01)

(52) U.S. Cl.
CPC ...... *H01L 27/3211* (2013.01); *H01L 27/3244* (2013.01); *H01L 51/50* (2013.01); *H01L 51/5016* (2013.01); *H01L 51/52* (2013.01); *H01L 51/5237* (2013.01); *H01L 51/5271* (2013.01); *H01L 51/5218* (2013.01)

(58) Field of Classification Search
USPC .......................................................... 257/40
See application file for complete search history.

(56) References Cited

U.S. PATENT DOCUMENTS

2014/0332779 A1* 11/2014 Lin ................... H01L 51/5271
  257/40
2015/0022772 A1* 1/2015 Akiyoshi ............. G02F 1/1339
  349/153

OTHER PUBLICATIONS

Chinese Office Action and Search Report for Chinese Patent Application 201610685005.1 dated Oct. 31, 2018.

\* cited by examiner

TOP-EMITTING WOLED DISPLAY DEVICE

CROSS-REFERENCE TO RELATED APPLICATIONS

This application claims the priority of Chinese patent application CN 201610685005.1, entitled "Top-emitting WOLED display device" and filed on Aug. 18, 2016, the entirety of which is incorporated herein by reference.

FIELD OF THE INVENTION

The present disclosure relates to the technical field of display, and in particular, to a top-emitting WOLED display device.

BACKGROUND OF THE INVENTION

At present, AMOLED screens are used in more and more cell phones. In an existing AMOLED screen, three sub-pixels of red, green and blue are prepared by using a fine metal mask (FMM). However, since requirements for screen resolutions are getting higher and higher, such technology for manufacturing the existing AMOLED screen cannot meet the requirements due to limitations of accuracy of the FMM. A combination of a top-emitting white organic light emitting diode (OLED) and a color filter (CF) is more suitable for manufacture of high-resolution AMOLED display devices.

An OLED has many advantages, such as light weight, thin thickness, high brightness, high response speed, wide viewing angle, no backlight, low manufacturing costs, and bendability. In a white OLED, a variety of fluorescent materials or phosphorescent materials that can emit different colors are combined, so that the white OLED can emit white light. However, the white OLED has a strong microcavity effect, and it is difficult to simultaneously emit white light with three peaks of red, green and blue. Thus, after white light passes through a color filter (CF), three primary colors of red, green and blue obtained have relatively poor purities. In order to overcome a microcavity effect of a top-emitting white OLED (WOLED), conventional practice is to increase thicknesses of anodes of the three sub-pixels of blue, green and red sequentially to adjust requirements of different light colors on cavity lengths. As shown in FIG. 1, such a structure is complicated and is difficult to be manufactured.

SUMMARY OF THE INVENTION

In view of the above problem in the prior art, the present disclosure provides a top-emitting WOLED display device which has a simple manufacturing procedure.

In the WOLED display device of the present disclosure, an optical turning layer 3 is added between anode layers 51 of three sub-pixels R, G and B and a reflective metal layer 2.

According to a preferred embodiment of the present disclosure, the anode layers of the three sub-pixels R, G and B have a same thickness.

According to a preferred embodiment of the present disclosure, the optical turning layer 3 is made of a transparent material having a refractive index n>1.7.

According to a preferred embodiment of the present disclosure, the optical turning layer 3 has a thickness in a range from 100 nm to 500 nm.

According to a preferred embodiment of the present disclosure, the optical turning layer 3 comprises two or more transparent thin films superimposed onto each other, and an oxide insert layer is provided between two adjacent transparent thin films.

According to a preferred embodiment of the present disclosure, the transparent thin film is an ITO thin film, an IZO thin film, or an AZO thin film.

According to a preferred embodiment of the present disclosure, the display device comprises a TFT array substrate 1, a reflective metal layer 2, an optical turning layer 3, a WOLED layer 5, an encapsulant resin material layer 6, a color filter 7, a sealant frame 4, and a cover glass 8. The reflective metal layer 2 is formed on TFT array substrate 1. The optical turning layer 3 is formed on the reflective metal layer 2. The WOLED layer 5 is formed on the optical turning layer 3. The encapsulant resin material layer 6 is formed on the WOLED layer 5. The cover glass 8 is arranged above an encapsulant resin material. The color filter 7 is fitted inside the cover glass 8. The cover glass 8 and the TFT array substrate 1 are fixed by the sealant frame 4.

According to a preferred embodiment of the present disclosure, the reflective metal layer 2 is made of aluminum, an aluminum alloy, silver or a silver alloy, and the reflective metal layer 2 has a thickness in a range from 80 nm to 300 nm.

According to a preferred embodiment of the present disclosure, the TFT array substrate 1 is a glass substrate, a plastic substrate, or a metal substrate.

According to a preferred embodiment of the present disclosure, the WOLED layer 5 comprises an anode layer 51, a light emitting unit, and a semi-transparent cathode layer.

According to a preferred embodiment of the present disclosure, the semi-transparent cathode layer is formed on a light emitting layer, and the light emitting unit is formed on the anode layer.

According to a preferred embodiment of the present disclosure, the semi-transparent cathode layer is made of a low work function metal material. A single low work function metal material or combinations of a plurality of low work function metal materials can be used, and the semi-transparent cathode layer has a thickness in a range from 10 nm to 30 nm.

According to a preferred embodiment of the present disclosure, the light emitting unit comprises a function layer, light emitting layers, and a connection layer. Function layers and light emitting layers can be increased or decreased in number, and can be combined through the connection layer, according to functional requirements.

According to a preferred embodiment of the present disclosure, the light emitting layers are of multiple colors. The light emitting layers of multiple colors can be increased or decreased in number, and can be combined according to the functional requirements.

According to a preferred embodiment of the present disclosure, the function layer is a combination of hole injection layers, hole transport layers, electron injection layers, and electron transport layers, and layers can be increased or decreased in number according to the functional requirements.

According to a preferred embodiment of the present disclosure, the anode layer 51 is an ITO thin film and/or an IZO thin film. The anode layer 51 has a thickness in a range from 10 nm to 100 nm.

The present disclosure has beneficial effects as follows. In the WOLED display device provided herein, the optical turning layer having a uniform thickness is added between the reflective metal layer and the anode layer of a WOLED layer. By arrangement of the optical turning layer, a distance between the WOLED layer and the reflective metal layer can be increased so as to reduce energy coupling of light emitted by the WOLED layer into a surface plasma state, thereby improving light emission efficiency and increasing an optically equivalent thickness. Because of the arrangement of the optical turning layer, a total cavity length of a white OLED is increased, and a microcavity effect of a top-emitting WOLED is overcome. In this way, it is not necessary to increase thicknesses of anode layers of three sub-pixels R, G and B, and it is possible to obtain white light having three peaks of red, green and blue by simply arranging the anode layers of R, G and B having a same thickness or arranging one anode layer having a uniform thickness. Thus, a manufacturing procedure is simplified. The present disclosure is well suited for manufacture of AMOLED display devices having a high resolution and wide color gamut.

The above technical features can be combined in any suitable manner, or substituted by the equivalent technical features, as long as the purpose of the present disclosure can be achieved.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

In the accompanying drawings, same components use same reference signs. The accompanying drawings are not drawn according to actual proportions.

DETAILED DESCRIPTION OF THE EMBODIMENTS

The technical solutions in the embodiments of the present disclosure will be explained clearly and completely below with reference to the accompanying drawings. Obviously, the embodiments described hereinafter are some of the embodiments, but not all the embodiments of the present disclosure. Based on the embidments in the present disclosure, all other embodiments obtained by one skilled in the art without the exercise of inventive faculty fall within the protection scope of the present disclosure.

It should be noted that, as long as there is no conflict, the embodiments of the present disclosure and features in the embodiments can be combined with each other.

The present disclosure will be illustrated further with reference to the drawings and the embodiments, but the present disclosure is not limited thereto.

The present disclosure is based on discoveries as follows.

Figure 1:
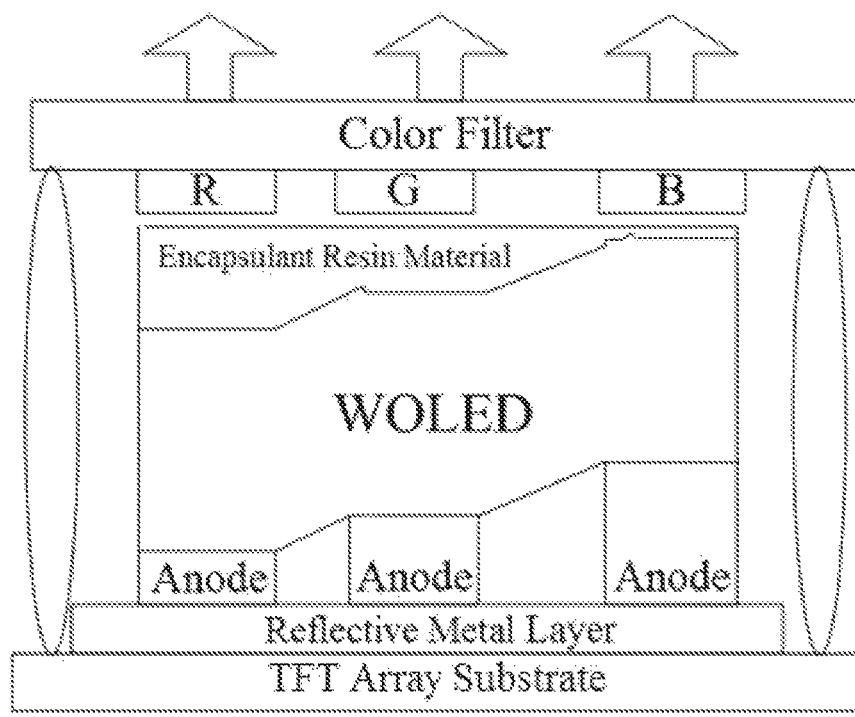
FIG. 1 schematically shows a principle of a top-emitting WOLED display device in the prior art.
Figure 2:
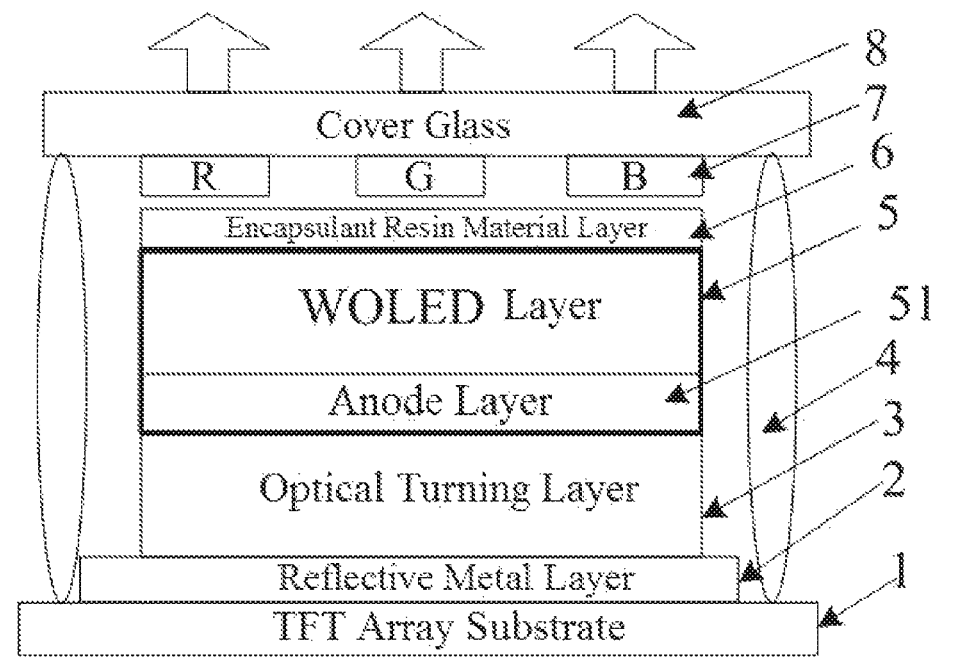
FIG. 2 schematically shows a principle of a top-emitting WOLED display device with an optical turning layer according to the present disclosure.
Figure 3:
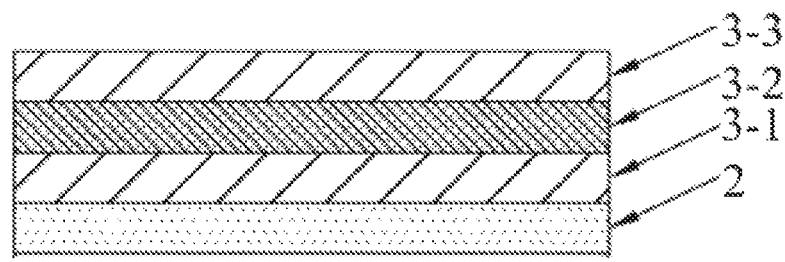
FIG. 3 schematically shows a principle of the optical turning layer according to the present disclosure.

As shown in FIG. 1, an existing top-emitting WOLED display device comprises a TFT array substrate, a reflective metal layer, a WOLED layer, an encapsulant resin material layer, a color filter, a sealant frame, and a cover glass. The reflective metal layer is formed on the TFT array substrate. The WOLED layer is formed on the reflective metal layer. The encapsulant resin material layer is formed on the WOLED layer. The cover glass is arranged above an encapsulant resin material. The color filter is fitted inside the cover glass. The cover glass and the TFT array substrate are fixed by the sealant frame.

An anode of the WOLED layer comprises an R anode layer, a G anode layer, and a B anode layer. In order to overcome a microcavity effect of a top-emitting white OLED (WOLED), thicknesses of the R anode layer, the G anode layer, and the B anode layer are increased sequentially to adjust requirements of different light colors on cavity lengths. Thus, a manufacturing difficulty is increased.

In view of the above problem, the present disclosure provides a top-emitting WOLED display device which has a simple manufacturing procedure.

In the WOLED display device provided in the present disclosure, an optical turning layer 3 having a uniform thickness is added between anode layers 51 of three sub-pixels R, G and B and a reflective metal layer 2 of the display device. The anode layers 51 of the three sub-pixels R, G and B have a same thickness.

In the present embodiment, in the WOLED display device, the optical turning layer having a uniform thickness is added between the reflective metal layer and the anode layers of a WOLED layer. By arrangement of the optical turning layer, a distance between the WOLED layer and the reflective metal layer can be increased so as to reduce energy coupling of light emitted by the WOLED layer into a surface plasma state, thereby improving light emission efficiency and increasing an optically equivalent thickness. Because of the arrangement of the optical turning layer, a total cavity length of a white OLED is increased, and a microcavity effect of a top-emitting white OLED is overcome. In this way, it is not necessary to increase the thicknesses of the anode layers of the three sub-pixels R, G and B, and it is possible to obtain white light having three peaks of red, green and blue by simply arranging the anode layers of R, G and B having a same thickness or arranging one anode layer having a uniform thickness. Thus, the manufacturing procedure is simplified. The present disclosure is well suited for manufacture of AMOLED display devices having a high resolution and wide color gamut. In a preferred embodiment, in the top-emitting WOLED display device, the optical turning layer 3 is added based on an existing top-emitting WOLED display device. The top-emitting WOLED display device according to the preferred embodiment specifically comprises a TFT array substrate 1, a reflective metal layer 2, an optical turning layer 3, a WOLED layer 5, an encapsulant resin material layer 6, a color filter 7, a sealant frame 4, and a cover glass 8.

The reflective metal layer 2 is formed on the TFT array substrate 1. The optical turning layer 3 is formed on the reflective metal layer 2. The WOLED layer 5 is formed on the optical turning layer 3. The encapsulant resin material layer 6 is formed on the WOLED layer 5. The cover glass 8 is arranged above an encapsulant resin material. The color filter 7 is fitted inside the cover glass 8. The cover glass 8 and the TFT array substrate 1 are fixed by the sealant frame 4.

In the WOLED display device provided in the present embodiment, the optical turning layer 3 having a uniform thickness is added between the reflective metal layer 2 and an anode layer 51 of the WOLED layer 5. By arrangement of the optical turning layer 3, a distance between the WOLED layer 5 and the reflective metal layer 2 can be increased so as to reduce the energy coupling of light emitted by the WOLED layer into a surface plasma state, thereby improving light emission efficiency and increasing an optically equivalent thickness.

The sealant frame 4 is used to prevent water vapor and oxygen outside from entering into internal components so as to protect the internal components.

The encapsulant resin material layer 6 and the cover glass 8 are used to block water and oxygen from eroding the WOLED layer.

In a preferred embodiment, the optical turning layer 3 is made of a transparent material having a refractive index n>1.7.

Further, the optical turning layer 3 has a thickness in a range from 100 nm to 500 nm.

It is known that, an organic light emitting assembly has an optically equivalent thickness in a range from 100 nm to 300 nm, which is approximately the same as a wavelength distance of destructive interference or constructive interference. In addition, it is known that, in three primary colors, a difference between wavelengths of red and green, and a difference between wavelengths of green and blue are roughly 100 nm, and therefore a resonator of an organic light emitting diode of a structure in the prior art is likely to have a problem of strengthening a certain primary color while weakening another primary color. Moreover, even if an organic light-emitting diode which enables the constructive interference to be in agreement with three primary colors of white light is designed, a blue shift of a resonance wavelength would still occur at a large viewing angle, resulting in a color shift.

Therefore, in the present embodiment, the optical turning layer 3 is made of a transparent material having a refractive index n>1.7, and the total cavity length of the white OLED can be increased, so that the optically equivalent thickness can be greatly increased to about 100 nm to 500 nm. Accordingly, the wavelength distance of the destructive interference or constructive interference can be much smaller than the difference between wavelengths of red and green, and the difference between wavelengths of green and blue, thereby enhancing peaks of total light emission in a dense and uniform manner, and alleviating color shifts in side views. A condition of optical design and manufacturing procedure can be relaxed. When the optical turning layer 3 of the present embodiment has a thickness of 285 nm, an optimal effect can be achieved.

In a preferred embodiment, the optical turning layer 3 comprises two or more transparent thin films superimposed on each other.

In a preferred embodiment, the transparent film can be an ITO thin film, or an IZO thin film, or an AZO thin film.

Further, an oxide insert layer can be added between two adjacent transparent films. The insert layer effectively suppresses crystallization of the transparent film as a thickness thereof increases, and reduces a square resistance, while transmittance of the optical turning layer 3 is not affected.

In the present embodiment, the ITO (Indium Tin Oxide) thin film, as a nano indium tin oxide, has excellent conductivity and transparency, and can prevent electronic radiations, ultraviolet and far infrared that are harmful to human bodies. The ITO thin film has conductivity of semiconductors. ITO is a wide energy band film material having a band gap of from 3.5 ev to 4.3 ev. An excitation threshold of a forbidden band in an ultraviolet region is 3.75 ev, which is equivalent to a wavelength of 330 nm. Therefore, light transmittance of the ITO film in the ultraviolet region is extremely low. Meanwhile, reflection occurs in a near infrared region due to plasma vibrations of carriers, and therefore the light transmittance of the ITO thin film in the near infrared region is also extremely low. However, the light transmittance of the ITO film is very high in a visible region. Due to specific physical and chemical properties of the film material itself, the ITO film has good conductivity and higher light transmittance in the visible region.

The IZO thin film (Indium Zinc Oxide) has adjustable compositions and multiple physical and chemical properties, and is suitable for low-temperature preparation. Besides, the IZO thin film has good plasticity, high mobility, and high work function. Thus, hole barriers can be reduced, and hole injection efficiency can be improved.

Al is doped into a ZnO system to obtain ZnO, i.e., the AZO thin film (Aluminum Zinc Oxide). After doping, conductivity of the film can be improved greatly, and a resistivity of the thin film is low. Moreover, a stability of the AZO transparent conductive thin film in hydrogen plasma is better than that of the ITO thin film, and the AZO thin film has photoelectric characteristics, which are similar to those of the ITO thin film. In addition, it is easy to prepare the AZO thin film. Resources of elements of the AZO thin film are more abundant than element In, and are non-toxic.

A method for manufacturing the optical turning layer 3 comprises steps as follows. A first layer ITO film layer 3-1 is deposited on the reflective metal layer 2 by magnetron sputtering. Next, an IZO film is deposited on the first ITO film layer 3-1 as an insert layer 3-2. Then a second ITO film layer 3-3 is deposited on the insert layer 3-2.

In a preferred embodiment, the reflective metal layer 2 is made of aluminum, an aluminum alloy, silver or a silver alloy, and the reflective metal layer 2 has a thickness in a range from 80 nm to 300 nm.

In the present embodiment, when the reflective metal layer 2 is made of silver and has a thickness of 100 nm, an optimal effect can be achieved.

In a preferred embodiment, the TFT array substrate 1 is a glass substrate, a plastic substrate, or a metal substrate.

In a preferred embodiment, the WOLED layer 5 comprises an anode layer 51, a light emitting unit 52, and a semi-transparent cathode layer 53. The semi-transparent cathode layer is formed on the light emitting unit, and the light emitting unit is formed on the anode layer 51.

In a preferred embodiment, the semi-transparent cathode layer is made of a low work function metal material. A single low work function metal material or a combination of a plurality of low work function metal materials can be used for making the semi-transparent cathode layer. A thickness of the semi-transparent cathode layer is in a range from 10 nm to 30 nm.

In the present embodiment, the semi-transparent cathode layer can be made of a commonly used low work function metal material, such as Li, Mg, Ca, Sr, La, Ce, Eu, Yb, Al, Cs, Rb, or alloys thereof. These cathode materials can be used alone, or in combination of two or more for making the semi-transparent cathode layer.

The semi-transparent cathode layer is formed by vacuum deposition.

The anode layer 51 is made of ITO and/or IZO, and/or a high work function metal, or an alloy of high work function metals, all of which are transparent materials such as Au, Pt, and Ag. A semi-transparent cathode is further included. Thus, color shifts of some colors in different viewing angles can be alleviated.

In a preferred embodiment, the light emitting unit 52 comprises a function layer, a connection layer 54, and a light emitting layer 523. Function layers and light emitting layers can be increased or decreased in number, and can be combined through the connection layer 54 according to functional requirements.

Further, the light emitting layers are of various colors. The light emitting layers of multiple colors can be increased or decreased in number, and can be combined according to the functional requirements.

In the present embodiment, in addition to a phosphorescent material having high luminous efficiency, a light emitting layer 523 can also be made of a fluorescent material having low luminous efficiency due to the arrangement the optical turning layer 3. The light-emitting layer has a thickness in a range from 0.01 nm to 10 nm.

In a preferred embodiment, the functional layer is a combination of a hole injection layer, a hole transport layer, an electron injection layer, and an electron transport layer, and layers can be increased or decreased in number according to functional requirements.

In a preferred embodiment, the anode layer 51 is an ITO thin film and/or an IZO thin film, and a thickness of the anode layer 51 is in a range from 10 nm to 100 nm. According to the present embodiment, the anode layer 51 is an ITO thin film. When the anode layer 51 has a thickness of 15 nm, an optimal effect can be achieved.

Embodiment 1 of WOLED Layer 5

A WOLED layer 5 of the present embodiment comprises an anode layer 51, two light emitting units 52, one connection layer 54, and a cathode layer 53.

A light emitting unit 52 comprises a hole injection layer 525, a hole transport layer 524 formed on the hole injection layer 525, a light emitting layer 523 formed on the hole transport layer 524, an electron transport layer 522 formed on the light emitting layer 523, and an electron injection layer 521 formed on the electron transport layer 522.

The light emitting layer 523 is arranged between the electron transport layer 522 and the hole transport layer 524, and traditional host-guest doped dyes are thus placed.

Figure 4:
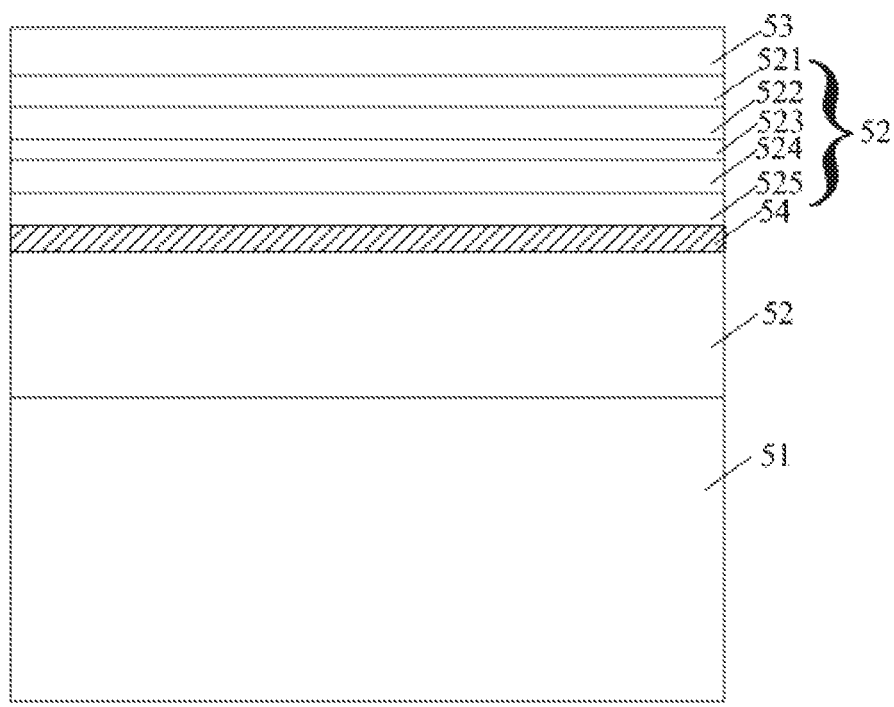
FIG. 4 schematically shows a principle of a WOLED layer comprising two light emitting units according to the present disclosure.

The cathode layer 53 is formed on the electron injection layer 521 of a first light emitting unit 521. The first light emitting unit and a second light emitting unit are connected to each other by the connection layer. A hole injection layer 525 of the second light emitting unit is formed on the anode layer, as shown in FIG. 4.

In the present embodiment, a light emitting layer of the first light emitting unit is made of a phosphorescent material that emits yellow light, and a light emitting layer of the second light emitting unit is made of a phosphorescent material that emits blue light. After mixing of the yellow light emitted by the first light emitting unit and the blue light emitted by the second light emitting unit, white light would be emitted.

An optical turning layer 3 of the present embodiment has a thickness in a range from 100 nm to 500 nm, preferably 285 nm, and has a refractive index about 1.8. A resonant cavity distance between the light emitting layer of the first light emitting unit and the reflective metal layer can be increased due to arrangement of the optical turning layer, whereby energy coupling of light emitted by the light emitting layer of the first light emitting unit can be reduced. Thus, light emitting efficiency can be improved.

Embodiment 2 of WOLED Layer 5

Figure 5:
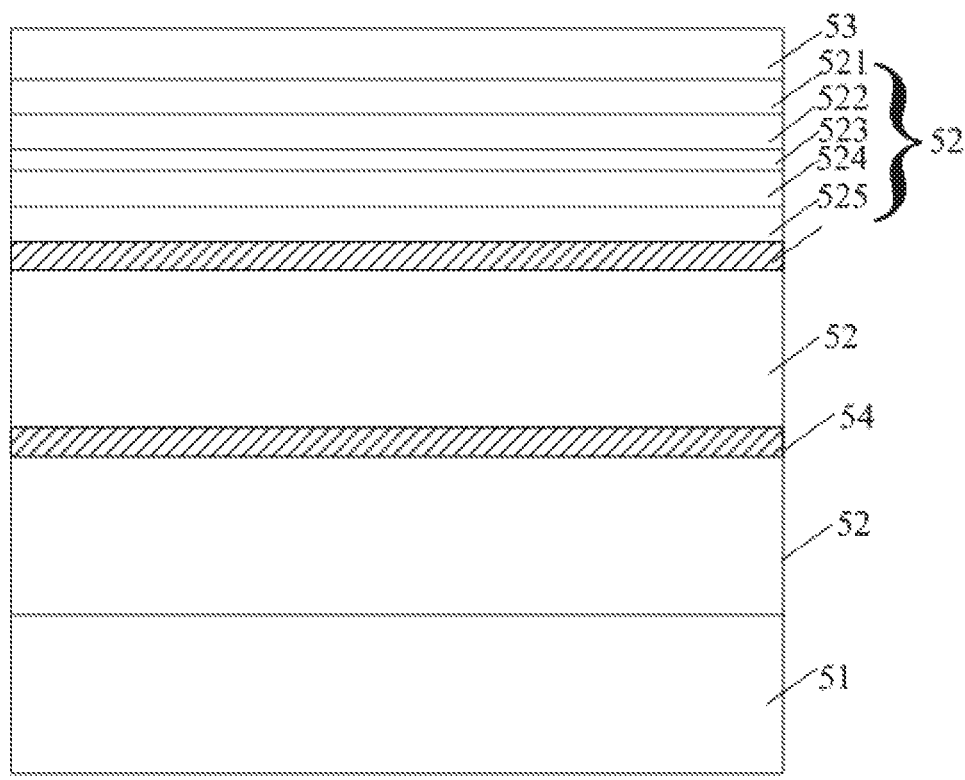
FIG. 5 schematically shows a principle of a WOLED layer comprising three light emitting units according to the present disclosure.

A WOLED layer 5 of the present embodiment comprises an anode layer 51, three light emitting units 52, two connection layers 54, and a cathode layer 53. A structure of a light emitting unit 52 is the same as that of Embodiment 1. A first light emitting unit and a second light emitting unit are connected to each other by a first connection layer, and the second light emitting unit and a third light emitting unit are connected to each other by a second connection layer, as shown in FIG. 5.

In the present embodiment, a light emitting layer of the first light emitting unit is made of a fluorescent material that emits red light; a light emitting layer of the second light emitting unit is made of a fluorescent material that emits green light; and a light emitting layer of the third light emitting unit is made of a fluorescent material that emits blue light. After mixing of the red light emitted by the first light emitting unit, the green light emitted by the second light emitting unit, and the blue light emitted by the third light emitting unit, white light would be emitted.

An optical turning layer 3 of the present embodiment has a thickness in a range from 100 nm to 500 nm, preferably 285 nm, and has a refractive index about 1.8. A resonant cavity distance between the light emitting layer of the first light emitting unit and the reflective metal layer can be increased due to an arrangement of the optical turning layer, whereby energy coupling of light emitted by the light emitting layer of the first light emitting unit can be reduced. Thus, light emitting efficiency can be improved.

An electron transport layer 522 of the present embodiment is made of Alq3, BPhen, BAlq, BCP, TmPyPB, or TPBi.

A hole transport layer 524 is made of mCP, TAPC, TCTA, NPB, or MADN.

Figure 6:
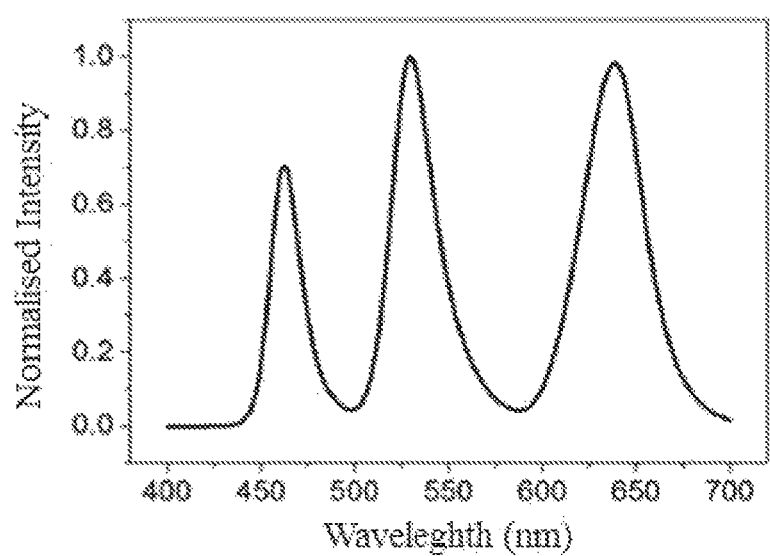
FIG. 6 schematically shows a curve of white light of three peaks of R, G, and B emitted by the top-emitting WOLED display device as shown in FIG. 2.

It can be seen from FIG. 6 that, a top-emitting WOLED display device having an optical turning layer can effectively emit white light of three peaks of red, green and blue. Three primary colors of red, green and blue of high color purity are generated after the white light passes through a color filter CF.

Although the present disclosure is described hereinabove with reference to specific embodiments, it can be understood that, these embodiments are merely examples of the principles and applications of the present disclosure. Hence, it can be understood that, numerous modifications can be made to the embodiments, and other arrangements can be made, as long as they do not go beyond the spirit and scope of the present disclosure as defined by the appended claims. It can be understood that, different dependent claims and features described herein can be combined in a manner different from those described in the initial claims. It can also be understood that, the technical features described in one embodiment can also be used in other embodiments.

The invention claimed is:

1. A top-emitting WOLED display device, comprising: a reflective metal layer, anode layer of three sub-pixels R, G, and B, and an optical turning layer between the anode layers of three sub-pixels R, G, and B and the reflective metal layer, wherein the anode layers of the three sub-pixels R, G, and B have a same thickness, and wherein the optical turning layer has a same thickness throughout each of the anode layers of the three sub-pixels R, G, and B.

2. The top-emitting WOLED display device according to claim 1, wherein the optical turning layer comprises two or more transparent films superimposed on each other.

3. The top-emitting WOLED display device according to claim 1, wherein the optical turning layer is made of a transparent material having a refractive index n >1.7.

4. The top-emitting WOLED display device according to claim 2, further comprising an oxide insert layer between each of the two or more transparent films superimposed on each other.

5. The top-emitting WOLED display device according to claim 1, wherein the optical turning layer has a thickness in a range from 100 nm to 500 nm.

6. The top-emitting WOLED display device according to claim 2, wherein the transparent films are ITO thin films, IZO thin films, or AZO thin films.

7. The top-emitting WOLED display device according to claim 1, wherein the reflective metal layer is made of aluminum, an aluminum alloy, silver, or a silver alloy.

8. The top-emitting WOLED display device according to claim 1, further comprising a TFT array substrate, a WOLED layer, an encapsulant resin material layer, a color filter, a sealant frame, and a cover glass,
wherein the reflective metal layer is formed on the TFT array substrate; the optical turning layer is formed on the reflective metal layer; the WOLED layer is formed on the optical turning layer the eneapsulant resin material layer is formed on the WOLED layer; the cover glass is arranged above the encapsulant resin material; the color filter is fitted inside the cover glass; and the cover glass and the TFT array substrate are fixed by the sealant frame.

9. The top-emitting WOLED display device according to claim 2, further comprising a TFT array substrate, a WOLED layer, an encapsulant resin material layer, a color filter, a sealant frame, and a cover glass,
wherein the reflective metal layer is formed on the TFT array substrate; the optical turning layer is formed on the reflective metal layer; the WOLED layer is formed on the optical turning layer the encapsulant resin material layer is formed on the WOLED layer; the cover glass is arranged above the encapsulant resin material; the color filter is fitted inside the cover glass; and the cover glass and the TFT array substrate are fixed by the sealant frame.

10. The top-emitting WOLED display device according to claim 3, further comprising a TFT array substrate, a WOLED layer, an eneapsulant resin material layer, a color filter, a sealant frame, and a cover glass,
wherein the reflective metal layer is formed on the TFT array substrate; the optical turning layer is formed on the reflective metal layer; the WOLED layer is formed on the optical turning layer the encapsulant resin material layer is formed on the WOLED layer; the cover glass is arranged above the eneapsulant resin material; the color filter is fitted inside the cover glass; and the cover glass and the TFT array substrate are fixed by the sealant frame.

11. The top-emitting WOLED display device according to claim 8, wherein the WOLED layer comprises an anode layer, a light emitting unit, and a semi-transparent cathode layer,
wherein the semi-transparent cathode layer is formed on a light emitting layer, and the light emitting unit is formed on the anode layer.

12. The top-emitting WOLED display device according to claim 11, wherein the semi-transparent cathode layer is made of a low work function metal material.

13. The top-emitting WOLED display device according to claim 11, wherein the light emitting unit comprises a function layer, a light emitting layer, and a connection layer.

14. The top-emitting WOLED display device according to claim 13, wherein the light emitting layers are of multiple colors.

15. The top-emitting WOLED display device according to claim 13, wherein the function layer is a combination of a hole injection layer, a hole transport layer, an electron injection layer, and an electron transport layer.

16. The top-emitting WOLED display device according to claim 12, wherein the semi-transparent cathode layer has a thickness in a range from 10 nm to 30nm.

* * * * *